United States Patent
Ju

(10) Patent No.: US 9,514,994 B2
(45) Date of Patent: Dec. 6, 2016

(54) FINFET DEVICE AND FABRICATION METHOD THEREOF

(71) Applicant: Semiconductor Manufacturing International (Shanghai) Corporation, Shanghai (CN)

(72) Inventor: Jianhua Ju, Shanghai (CN)

(73) Assignee: SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 0 days.

(21) Appl. No.: 14/987,192

(22) Filed: Jan. 4, 2016

(65) Prior Publication Data

US 2016/0197017 A1    Jul. 7, 2016

(30) Foreign Application Priority Data

Jan. 6, 2015    (CN) .......................... 2015 1 0005573

(51) Int. Cl.

| | |
|---|---|
| H01L 21/336 | (2006.01) |
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 27/148 | (2006.01) |
| H01L 29/768 | (2006.01) |
| H01L 21/8238 | (2006.01) |
| H01L 27/092 | (2006.01) |

(52) U.S. Cl.
CPC ............. *H01L 21/823821* (2013.01); *H01L 21/823828* (2013.01); *H01L 21/823857* (2013.01); *H01L 27/0924* (2013.01)

(58) Field of Classification Search
CPC ............ H01L 21/823821; H01L 21/823828; H01L 21/823857; H01L 27/0924
USPC .......... 257/380, 221, 378, 407, 259; 438/299
See application file for complete search history.

(56) References Cited

U.S. PATENT DOCUMENTS

| | | | |
|---|---|---|---|
| 2012/0217586 A1* | 8/2012 | Chern | H01L 27/0629 257/380 |
| 2016/0204109 A1* | 7/2016 | Kim | H01L 27/092 257/369 |
| 2016/0204245 A1* | 7/2016 | Jangjian | H01L 29/785 257/401 |

* cited by examiner

*Primary Examiner* — David S Blum
(74) *Attorney, Agent, or Firm* — Anova Law Group, PLLC

(57) ABSTRACT

A method for forming a FinFET device is provided. The method includes providing a substrate having a first region and a second region; and forming a plurality of fins on the substrate. The method also includes forming a plurality of doping regions with different doping concentrations in the fins in the first region; and forming a plurality of dummy gate structures over the plurality of fins. Further, the method includes forming source and drain regions in the plurality of fins at both sides of the dummy gate structures; and removing the dummy gate structures to form a plurality of openings to expose the plurality of fins. Further, the method also includes forming a plurality of work function layers with different work functions on the exposed fins in the openings in the second region; and forming gate structures in the openings.

20 Claims, 4 Drawing Sheets

US 9,514,994 B2

FINFET DEVICE AND FABRICATION METHOD THEREOF

CROSS-REFERENCES TO RELATED APPLICATIONS

This application claims the priority of Chinese patent application No. 201510005573.8, filed on Jan. 6, 2015, the entirety of which is incorporated herein by reference.

FIELD OF THE INVENTION

The present invention generally relates to the field of semiconductor manufacturing technology and, more particularly, relates to FinFET devices and fabrication processes thereof.

BACKGROUND

Usually, the gate of a conventional Metal Oxide Semiconductor Field Effect Transistor (MOSFET) is a planar structure. When the critical dimension of the MOSFET is shrunk to a certain value, the short channel effects of the MOSFET become more prominent. The sub-threshold current and the gate leakage current are increased. Thus, the performance of the MOSFET is adversely affected. It is often difficult to further reduce the critical dimension of the conventional MOSFET.

The multiple-gate MOSFET has a better gate control ability; and is able to inhibit the short channel effects. Fin Field Effect Transistor (FinFET) devices are a typical type of multiple-gate MOSFETs. The FinFET devices are often formed on a bulk silicon substrate, or on a Silicon-On-Insulation (SOI) substrate. The FinFET devices are able to match certain technical requirements.

Under certain conditions, it requires the FinFET devices to have variable threshold voltages. That is, it requires the PMOS transistors and the NMOS transistors in a FinFET device to have different threshold voltages (multiple-VT).

However, it may be difficult for the existing techniques to form a FinFET device having PMOS transistors and NMOS transistors with different threshold voltages. The disclosed device structures and methods are directed to solve one or more problems set forth above and other problems.

BRIEF SUMMARY OF THE DISCLOSURE

One aspect of the present disclosure includes providing a method for fabricating a FinFET device. The method includes providing a substrate having a first region and a second region; and forming a plurality of fins on the substrate. The method also includes forming a plurality of doping regions with different doping concentrations in the fins in the first region; and forming a plurality of dummy gate structures over the plurality of fins. Further, the method includes forming source and drain regions in the plurality of fins at both sides of the dummy gate structures; and removing the dummy gate structures to form a plurality of openings to expose the plurality of fins. Further, the method also includes forming a plurality of work function layers with different work functions on the exposed fins in the openings in the second region; and forming gate structures in the openings.

Another aspect of the present disclosure includes providing a FinFET device. The FinFET device includes a substrate having a PMOS region and an NMOS region. The FinFET device also includes a plurality of PMOS transistors having different work functions formed in the PMOS region of the substrate; and a plurality of NMOS transistors having different work functions formed in the NMOS region of the substrate. Wherein a gate structure of each of NMOS transistors and a corresponding fin has a work function layer in between, and different work function layers have different work functions; and the fins of the PMOS transistors have doping regions having different doping concentrations to adjust the work function of the fins of the PMOS transistors.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

To form a plurality of PMOS transistors having different threshold voltages and a plurality of NMOS transistors having different threshold voltages in a FinFET device, a commonly used technique is to dope the fins of the FinFET device to cause the PMOS transistors to have different threshold voltages and the NMOS transistors to have different threshold voltages. The critical dimension of the transistors has become smaller and smaller, it may be more and more difficult to dope the increasingly smaller fins to change the threshold voltages of the transistors. The doping resolution may be adversely affected. Thus, the accuracy of the threshold voltage adjustment may be reduced. Further, it may also reduce the stability of the chancel regions in the fins after the doping process; and the performance of the FinFET device may be adversely affected.

Another existing approach to adjust the threshold voltages of PMOS transistors and NMOS transistors in a FinFET device is to form work function layers. That is, by forming work function layers made of different materials in the PMOS and NMOS transistors, the work functions of such transistors may be adjusted. However, when a desired work function layer is formed on a transistor, it may need form a mask layer to protect other transistors in the FinFET device. Thus, it may need form a plurality of mask layers and a plurality of different work function layers to form the PMOS transistors with different threshold voltages and the NMOS transistors with different threshold voltages. Further, forming working function layers may be unable to effectively adjust the threshold voltages of the PMOS transistors. Accordingly, an improved FinFET transistor structure and fabrication process is provided.

Figure 6:
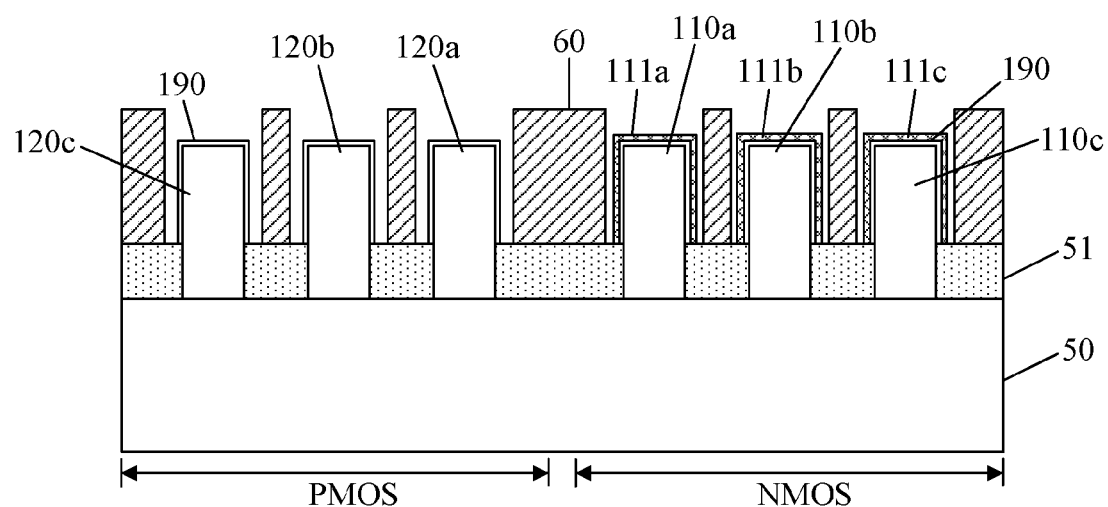
Figure 7:
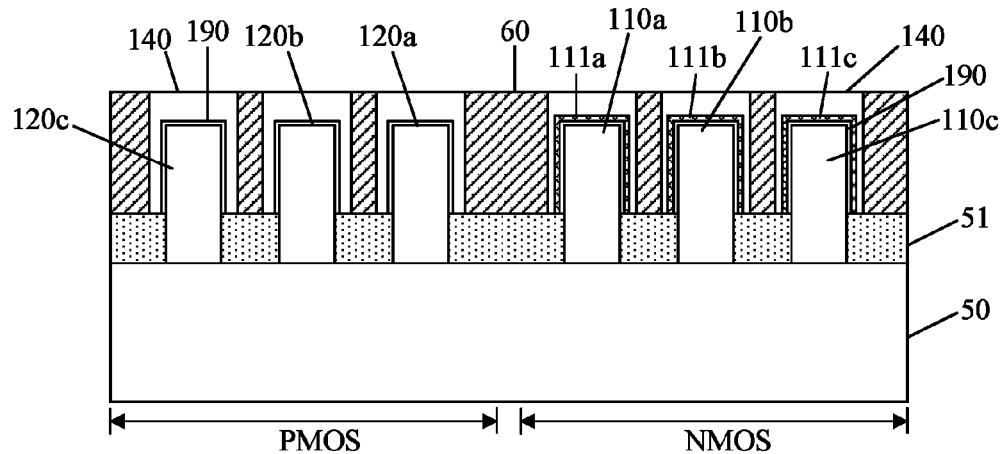
Figure 8:
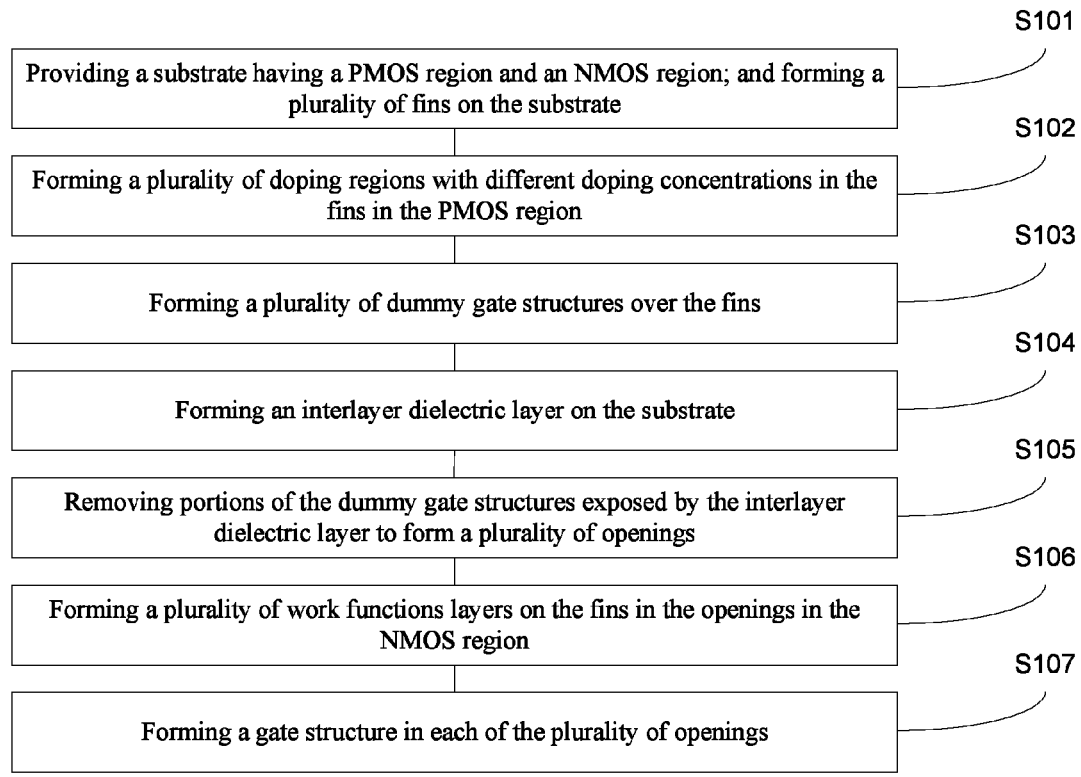
FIG. 8 illustrates an exemplary fabrication process of a FinFET device consistent with the disclosed embodiments.

FIG. 8 illustrates an exemplary fabrication process of a FinFET device consistent with the disclosed embodiments. FIGS. 1~7 illustrate semiconductor structures corresponding certain stages of the exemplary fabrication process.

Figure 1:
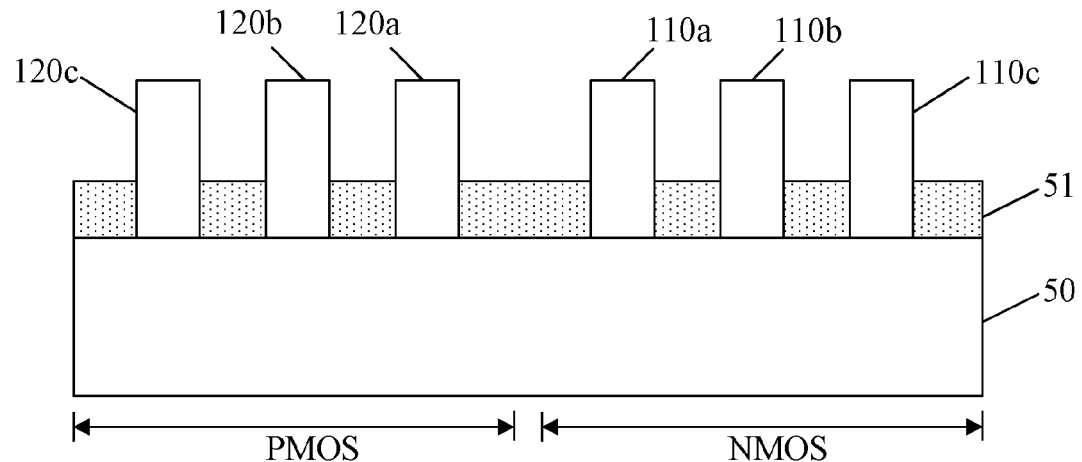
FIGS. 1-7 illustrate semiconductor structures corresponding to certain stages of an exemplary fabrication process of a FinFET device consistent with the disclosed embodiments.

As shown in FIG. 8, at the beginning of fabrication process, a substrate with certain structures is provided (S101). FIG. 1 illustrates a corresponding semiconductor structure.

As shown in FIG. 1, a substrate 50 is provided. The substrate 50 may have a PMOS region and an NMOS region. The PMOS region may be used to subsequently form a plurality of PMOS transistors with different threshold voltages; and the NMOS region may be used to subsequently form a plurality of NMOS transistors with different threshold voltages.

Further, a plurality of fins may be formed on the substrate 50 in the PMOS region and the NMOS region, respectively. For illustrative purposes, three fins may be formed in the to PMOS regions; and the fins in the PMOS region may be referred as a first fin 120a, a second fin 120b, and a third fin 120c. Three fins may be formed in the NMOS regions, and the fins in the NMOS region may be referred as a fourth fin 110a, a fifth fin 110b, and a sixth fin 110c.

Further, an insulation layer 51 may be formed on a surface of the substrate 50 to insulate the adjacent fins. The fins may protrude from the surface of the insulation layer 51. That is, the top surfaces of the fins may be higher than the top surface of the insulation layer 51.

The substrate 50 may be made of any appropriate semiconductor materials, such as single crystal silicon, polysilicon, silicon on insulator (SOI), silicon germanium, carborundum, indium antimonite, lead telluride, indium arsenide, indium phosphate, gallium arsenide, gallium antimonite, alloy semiconductor or a combination thereof. The substrate 50 provides a base for subsequent devices and processes.

The fins may be formed by etching a portion of the substrate 50. Thus, the fins may be made of a same material as the substrate 50. In certain other embodiments, the fins may be formed on the substrate 50 by a chemical vapor deposition (CVD) process, a physical vapor deposition (PVD) process, an atomic layer deposition (ALD) process, or an epitaxial growth process, etc. The fins may be made of any appropriate semiconductor material, such as silicon, germanium, silicon germanium, carborundum, indium antimonite, lead telluride, indium arsenide, indium phosphate, gallium arsenide, gallium antimonite, alloy semiconductor or a combination thereof.

The insulation layer 51 may be made of any appropriate material, such as silicon oxide, silicon nitride, or silico oxynitride, etc. Various processes may be used to form the insulation layer 51, such as a CVD process, a PVD process, or an ALD process, etc.

Referring to FIG. 1, the first fin 120a, the second fin 120b, and the third fin 120c in the PMOS region may be doped to form a well region (not shown) of PMOS transistors. The fourth fin 110a, the fifth fin 110b, and the sixth fin 110c may be doped to form a well region (not shown) of NMOS transistors.

Figure 2:
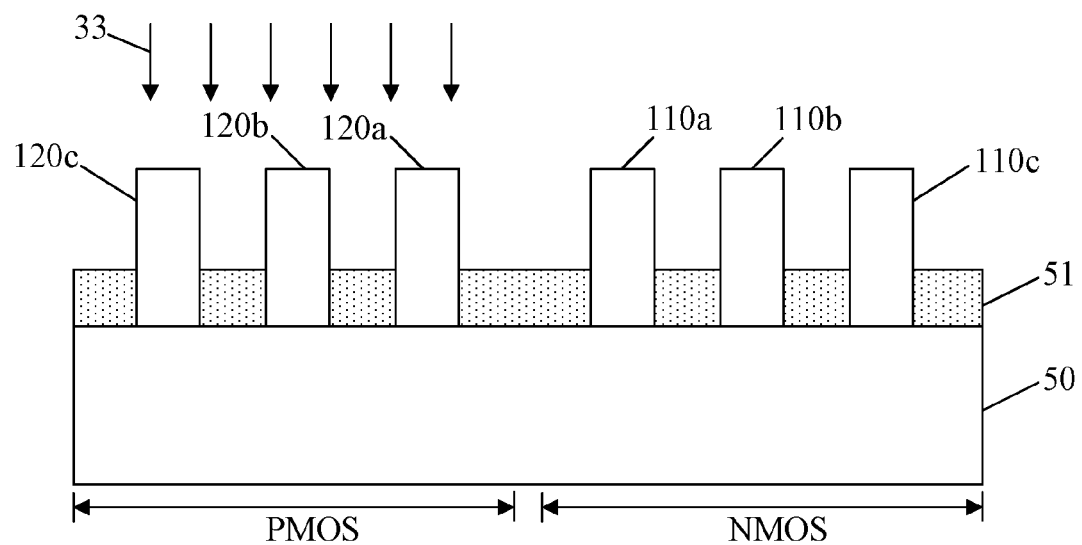

Returning to FIG. 8, after forming the plurality of fins, a plurality of doping regions may be formed (S102). FIG. 2 illustrates a corresponding semiconductor structure.

As shown in FIG. 2, after forming the plurality of fins and the insulation layer 51, doping process 33 may be performed on the first fin 120a, the second fin 120b and the third fin 102c to form a plurality of doping regions (not shown) with different doping concentrations in the PMOS region. The doping regions with different doping concentrations may be used to subsequently form PMOS transistors with different threshold voltages.

In one embodiment, the doping concentrations of the first fin 120a, the second fin 120b and the third fin 120c may be different. The first fin 120a, the second fin 120b and the third fin 120c may be used to subsequently form different PMOS transistors. Thus, the threshold voltages of the different PMOS transistors may be different.

In certain other embodiments, each of the plurality of fins in the PMOS region may be used to form a plurality of transistors. Thus, a plurality of doping regions with different doping concentrations may be formed on each of the first fin 120a, the second fin 120b and the third fin 120c.

Comparing with the approach that utilizes work function layers to adjust the threshold voltages of the PMOS transistors, directly doping the plurality of fins including the first fin 120a, the second fin 120b and the third fin 120c may have a more effective doping result. Thus, the threshold voltages of the subsequently formed PMOS transistors may be effectively adjusted to be different.

Further, the doping method may only need to form a mask to expose the fin needed to be doped, and cover the fins not be doped; and dope the exposed fin. While the approach utilizing the work function layers to adjust the threshold voltages of different PMOS transistors may need the similar mask; and also need deposit different work function layers made of different materials, etc. Thus, the doping method for adjusting the work function of the PMOS transistors may be relative simple; and the production cost may be significantly reduced.

The first fin 120a, the second fin 120b and the third fin 120c may be doped with any appropriate process, such as an ion implantation process, or a thermal diffusion process, etc. In one embodiment, the first fin 120a, the second fin 120b and the third fin 120c are doped by an ion implantation process. The doping ions may be As ions, or P ions, etc.

Specifically, a mask layer exposing a certain fin in the PMOS region, and covering other fins may be formed firstly, and the ion implantation process may be performed to dope the exposed fin. Then the mask layer may be removed; and a second mask layer exposing another fin in the PMOS region may be formed. Another ion implantation process with a different doping dose may be performed on the exposed fin. The fins in the PMOS region may be doped by the ion implantation process with different doses one by one. Thus, the fins in the PMOS region may be doped with different concentrations of doping ions.

Figure 3:
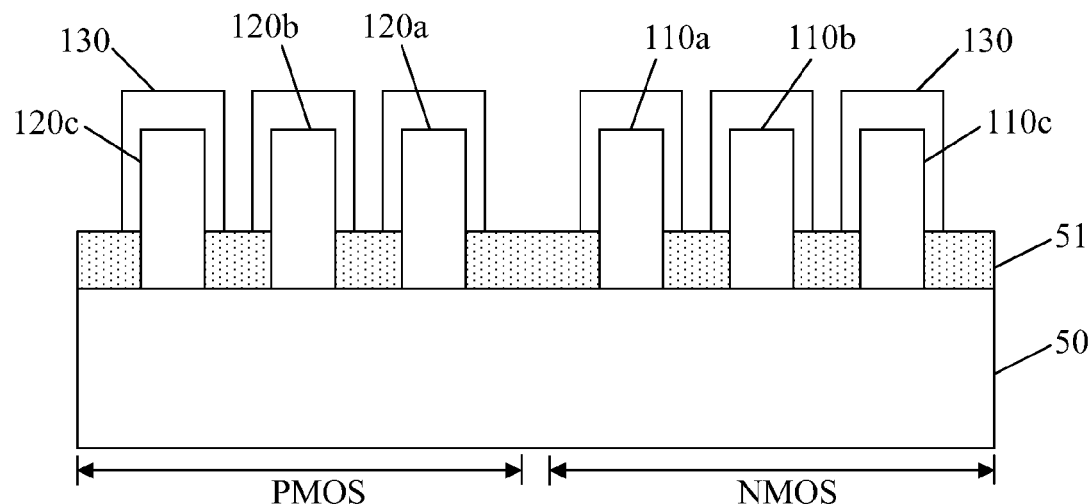

Returning to FIG. 8, after doping the first fin 120a, the second fin 120b and the third fin 120c, a plurality of dummy gate structures may be formed (S103). FIG. 3 illustrates a corresponding semiconductor structure.

As shown in FIG. 3, a plurality of dummy gate structures 130 are formed over the first fin 120a, the second fin 120b, and the third fin 120c in the PMOS region, and the fourth fin 110a, the fifth fin 110b and the six fin 110c in the NMOS region. The dummy gate structures 130 in the PMOS region may be corresponding to the doping regions with different doping concentrations. That is, the dummy gate structures 130 in the PMOS regions may cover the doping regions with the different doping concentrations.

In one embodiment, a process for forming the plurality of dummy gate structures 130 may include forming a dummy gate oxide layer (not shown) over the first fin 110a, the second fin 110b, and the third fin 110c in the NMOS region, and the fourth fin 120a, the fifth fin 120b, and the six fin 120c in the PMOS region; and forming a polysilicon layer (not shown) on the dummy gate oxide layer. Thus, the plurality of dummy gate structures 130 may be formed.

The dummy gate oxide layer may be made of any appropriate material, such as silicon oxide, or silicon oxynitride, etc. Various processes may be used to form the dummy gate oxide layer, such as a CVD process, a PVD process, or an ALD process, etc. Various processes may be used to form the polysilicon layer, such as a CVD process, or furnace process, etc.

Further, after forming the dummy gate structures 130, source/drain regions (not shown) of PMOS transistors and NMOS transistors may be formed in the first fin 120a, the second fin 120b, the second fin 120c, the fourth fin 110a, the fifth fin 110b, and the sixth fin 110c at both sides of the dummy gate structures 130.

In one embodiment, a process for forming the source/drain regions may include forming openings in the first fin 120a, the second fin 120b, the second fin 120c, the fourth fin 110a, the fifth fin 110b, and the sixth fin 110c at both sides of the dummy gate structures 130; and followed by forming a source/drain material layer in the openings. Thus, the source/drain regions of the PMOS transistors and the NMOS transistors may be formed in the openings.

The source/drains may be made of any appropriate material, such as silicon, silicon germanium, or silicon carbide, and silicon phosphorus, etc. Various processes may be used to form the source/drain material layer in the openings, such as a CVD process, a PVD process, or an epitaxial growth process, etc. In one embodiment, the source/drain material layer is formed by an in situ doping epitaxial growth process. That is, when the source/drain material is being filled in the openings, a doping process may be performed simultaneously.

In certain other embodiments, the source/drain material layer of the PMOS transistors and the source/drain material layer of the NMOS transistors may be different. Accordingly, the source/drain material layer of the PMOS transistors and the source/drain material layer of the NMOS transistors may be formed by separated processes.

Further, in one embodiment, after forming the source/drain regions of the NMOS transistors and the source/drain regions of the PMOS transistors, the source/drain regions of the NMOS transistors and the source/drain regions of the PMOS transistors may be further doped. Specifically, the source/drain regions of the NMOS transistors may be doped with N-type ions and the source/drain regions of the PMOS transistors may be doped with P-type ions.

The source/drain regions of the NMOS transistors and the source/drain regions of the PMOS transistors may be doped by any appropriate process, such as an ion implantation process, or a thermal diffusion process, etc. The source/drain regions of the NMOS transistors and the source/drain regions of the PMOS transistors may be doped by separated steps.

Figure 4:
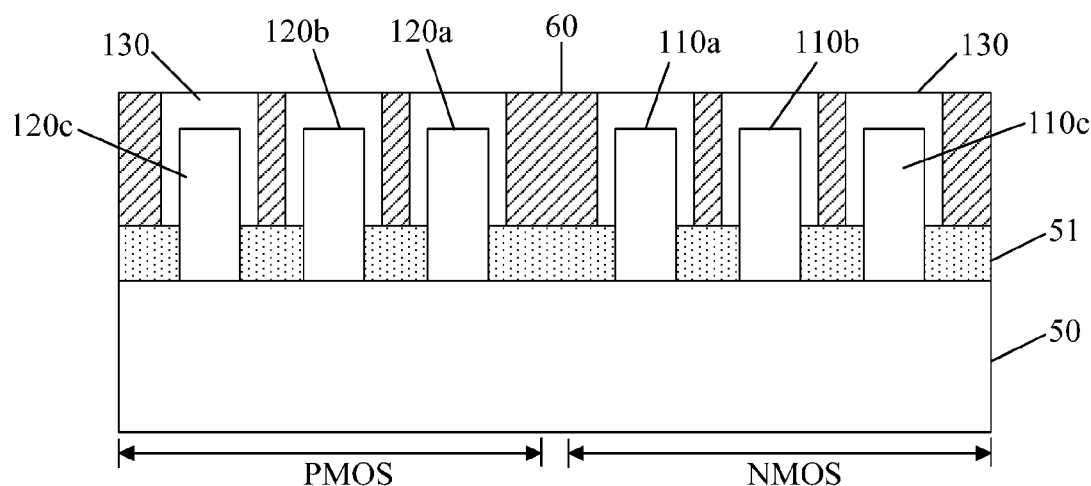

Returning to FIG. 8, after forming the source/drain regions, an interlayer dielectric layer may be formed (S104). FIG. 4 illustrates a corresponding semiconductor structure.

As shown in FIG. 4, an interlayer dielectric layer (ILD) 60 is formed on the substrate 50, the source/drain regions, the first fin 120a, the second fin 120b, the third fin 120c, the fourth fin 110a, the fifth fin 110b, and the sixth fin 110c. The interlayer dielectric layer 60 may be used to define the subsequently formed gate structures of the NMOS transistors and PMOS transistors after subsequently removing the dummy gate structures 130.

In one embodiment, a process for forming the interlayer dielectric layer 60 may include forming an interlayer dielectric material layer on the insulation layer 51, the source/drain regions, the first fin 120a, the second fin 120b, the third fin 120c, the fourth fin 110a, the fifth fin 110b, and the sixth fin 110c; and followed by planarizing the interlayer dielectric material layer until the top surfaces of the dummy gate structures 130 are exposed. Thus, the remaining interlayer dielectric material layer may form the interlayer dielectric layer 60.

The interlayer dielectric material layer may be made of any appropriate material, such as silicon oxide, silicon nitride, or silicon oxynitride, etc. Various processes may be used to form the interlayer dielectric material layer, such as a CVD process, an ALD process, or an FCVD process, etc.

Various processes may be used to planarize the interlayer dielectric material layer, such as a chemical mechanical polishing process, or a physical mechanical polishing process, etc. In one embodiment, a chemical mechanical polishing process is used to planarize the interlayer dielectric material layer to form the interlayer dielectric layer 60.

Figure 5:
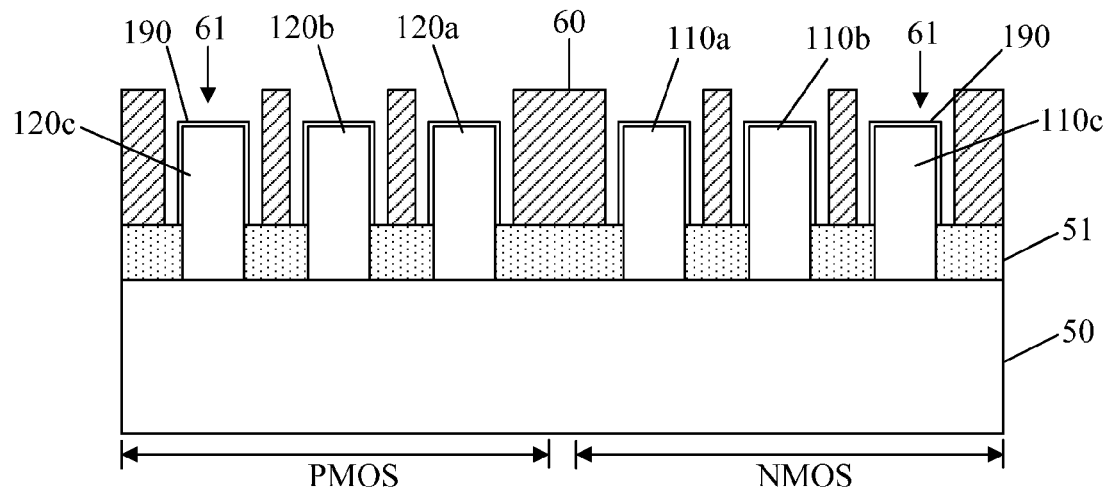

Returning to FIG. 8, after forming the interlayer dielectric layer 60, portions of the dummy gate structures 130 exposed by the interlayer dielectric layer 60 may be removed (S105). FIG. 5 illustrates a corresponding semiconductor structure.

As shown in FIG. 5, portions of the dummy gate structures 130 exposed by the interlayer dielectric layer 60 in the PMOS region and the NMOS region are removed; and a plurality of openings 61 may be formed. The plurality of openings 61 may be used to subsequently form gate structures of the NMOS transistors and the PMOS transistors. Because the plurality of the dummy gate structures 130 may be formed over the first fin 120a, the second fin 120b, the third fin 120c, the fourth fin 110a, the fifth fin 110b, and the sixth fin 110c, the first fin 120a, the second fin 120b, the third fin 120c, the fourth fin 110a, the fifth fin 110b, and the sixth fin 110c may be exposed by the openings 61 after removing the portions of the dummy gate structures 130.

In one embodiment, the dummy gate structures 130 may include a dummy gate oxide layer and a polysilicon layer formed on the dummy gate oxide layer. Thus, the polysilicon layer and the dummy gate oxide layer may be sequentially removed. Various processes may be used to remove the polysilicon layer and the dummy gate oxide layer, such as a dry etching process, or a wet etching process, etc.

In one embodiment, the gate structures of the NMOS transistors and the PMOS transistors may be high dielectric constant (high-K) metal gate (HKMG) structures. Thus, as shown in FIG. 5, after forming the openings 61, a stacked-layer structure 190 may be formed on the first fin 120a, the second fin 120b, the third fin 120c, the fourth fin 110a, the fifth fin 110b, and the sixth fin 110c. The stacked-layer structure 190 may include an oxide interlayer (not labeled) formed on the first fin 120a, the second fin 120b, the third fin 120c, the fourth fin 110a, the fifth fin 110b, and the sixth fin 110c exposed by the openings 61; a high-K dielectric layer (not labeled) formed on the oxide interlayer; and a first cap layer formed on the high-K dielectric layer.

The oxide interlayer may be used to increase the adhesion force between the first fin 120a, the second fin 120b, the third fin 120c, the fourth fin 110a, the fifth fin 110b, and the sixth fin 110c and the subsequently formed high-K dielectric layer. The oxide interlayer may also be used as a buffer layer to reduce the stress in the first fin 120a, the second fin 120b, the third fin 120c, the fourth fin 110a, the fifth fin 110b and the sixth fin 110c caused by subsequently forming other material layers.

The oxide interlayer may be made of any appropriate material. In one embodiment, the oxide inter layer may be made of silicon oxide. Various processes may be used to form the oxide interlayer, such as a CVD process, an ALD process, or a thermal oxidation process, etc.

After forming the oxide interlayer, the high-K dielectric layer may be formed on the oxide interlayer. The oxide interlayer may be used as a transition layer for forming the high-K dielectric to reduce the stress and the interface status between the high-K dielectric layer and the first fin 120a, the second fin 120b, the third fin 120c, the fourth fin 110a, the fifth fin 110b, and the sixth fin 110c. At the same time, the oxide interlayer may increase the adhesion force between the high-K dielectric layer and the first fin 120a, the second fin 120b, the third fin 120c, the fourth fin 110a, the fifth fin 110b, and the sixth fin 110c. Accordingly, the reliability of the subsequently formed HKMG structures may be improved.

The high-K dielectric layer may be made of any appropriate material, such as one or more of LaO, AlO, BaZrO, HfZrO, HfZrON, HfLaO, HfSiO, HfSiON, LaSiO, AlSiO, HfTaO, (Ba, Sr)TiO$_3$ (BST), Al$_2$O$_3$, Si$_3$N$_4$, and oxynitride, etc. Various processes may be used to form the high-K dielectric layer, such as a CVD process, a PVD process, or an ALD process, etc.

Further, after forming the high-K dielectric layer, the first cap layer may be formed on the high-K dielectric layer. The first cap layer may be used to prevent the metal of the subsequently formed metal gates from diffusing into the fins. The first cap layer may also be used to prevent the metal in the subsequently formed work function layers from radially diffusing.

The first cap layer may be made of any appropriate material, such as TiN, Ta, or TaN, etc. Various processes may be used to form the first cap layer, such as a CVD process, a PVD process, or an ALD process, etc.

Further, after forming the first cap layer, a uniform work function layer (not shown) may be formed on the first cap layer in the NMOS region and the PMOS region. The uniform work function layer may be used to adjust the work function of all the PMOS transistors as a whole. That is, the uniform work function layer may adjust the work function of all the PMOS transistors with a same value. The portion of the uniform work function layer in the NMOS region may be subsequently removed; and a plurality of work function layers with different work functions may be subsequently formed in the NMOS region.

Further, after forming the uniform work function layer, a second cap layer (not shown) may be formed on the uniform work function layer. The second cap layer may also be used to prevent the metal of the subsequently formed metal gates from diffusing into the fins. The second cap layer may also be used to prevent the metal in the subsequently formed work function layers from radially diffusing.

The second cap layer may be made of any appropriate material, such as Ta, or TaN, etc. Various processes may be used to form the second cap layer, such as a CVD process, a PVD process, or an ALD process, etc.

Further, after forming the second cap layer, a patterned photoresist layer (not shown) may be formed on the second cap layer. The patterned photoresist layer may cover the second cap layer in the PMOS region, and expose the second cap layer in the NMOS region.

After forming the patterned photoresist layer, the portion of the second cap layer in the NMOS region and the portion of the uniform work function layer in the NMOS region may be removed. The portion of the second cap layer in the NMOS region and the portion of the uniform work function layer in the NMOS region may be removed by any appropriate process, such as a wet etching process, or a dry etching process, etc.

After removing the portion of the second cap layer in the NMOS region and the portion of the uniform work function layer in the NMOS region, the patterned photoresist layer may be removed. The patterned photoresist layer may be removed by any appropriate process, such as a dry etching process, a wet etching process, or a plasma ashing process, etc.

Returning to FIG. 8, after removing the portion of the second cap layer in the NMOS region and the portion of the uniform work function layer in the NMOS region, a plurality of work function layers may be formed in the NMOS region (S106). FIG. 6 illustrates a corresponding semiconductor structure.

As shown in FIG. 6, a work function layer is formed in on the fin in each of the plurality of openings 61 in the NMOS region. Specifically, for illustrative purposes, a first work function layer 111a, a second work function layer 111b, and a third work function layer 111c are formed on the fourth fin 110a, the fifth fin 110b and the sixth fin 110c in the openings 61 in the NMOS region, respectively. The work functions of the first work function layer 111a, the second work function layer 111b, and the third work function layer 111c may be different.

The work function of a work function layer may be inversely proportional to the threshold voltage of a transistor having such a work function layer. Thus, the subsequently formed NMOS transistors in the NMOS region having the first work function layer 111a, the second work function layer 111b and the third work function layer 111c may have different threshold voltages.

Using the work function layers may be able to precisely adjust the threshold voltages of each of the NMOS transistors. Thus, the threshold voltage mismatch between different NMOS transistors may be reduced. Further, comparing with the approach utilizing doping processes to adjust the work function, forming work function layers on the fins may have relatively small effects on the portions of the fins being used as the channel regions of the NMOS transistors.

Thus, the threshold voltages of the PMOS transistors in the PMOS region may be adjusted to be different by directly doping the fins in the PMOS region. The threshold voltages of NMOS transistors in the NMOS region may be adjusted to be different by forming work function layers with different work functions on the fins in the NMOS region. Such an approach may obtain an optimum balance between the process difficulty, the production cost, the stability of the transistors and the effectiveness of the threshold voltage adjustment.

The first work function layer 111a, the second work function layer 111b and the third work function layer 111c may include a single layer work function material layer, or a plurality of work function material layers. The work function material layer may be made of any appropriate material, such as TiAl, or carbon doped TiAl alloy, etc. Such materials may have different work functions.

In practical applications, the different work functions at different positions of the fins in the NMOS region may also be realized by forming different work function material layers. Accordingly, the threshold voltages of the different NMOS transistors may be adjusted.

After forming the first work function layer 111a, the second work function layer 111b and the third work function layer 111c, the first work function layer 111a, the second work function layer 111b and the third work function layer 111c may be doped with different ions. The doping ions may be able to further adjust the work functions of the first work function layer 111a, the second work function layer 111b, and the third work function layer 111c, respectively. In one embodiment, the doping ions may be one or more of N ions, H ions, F ions, O ions, Al ions, Ta ions, C ions, and P ions, etc.

Returning to FIG. 8, after forming the first work function layer 111*a*, the second work function layer 111*b*, and the third work function layer 111*c*, gate structures may be formed (S107). FIG. 7 illustrates a corresponding semiconductor structure.

As shown in FIG. 7, a gate structure 140 is formed in each of the openings 61. A process for forming the gate structure 140 may include forming a gate dielectric layer in the openings 61; and followed by forming a metal gate layer on the gate dielectric layer. In one embodiment, the gate dielectric layer may be the high-K dielectric layer on the stacked-layer structure 190. Thus, the gate structure 140 may be formed by forming a metal gate layer on the stacked-layer structure 190. The gate structure 140 may include the metal gate layer and the high-K dielectric layer. Thus, the gate structures 140 may be referred as HKMG structures.

The metal gate layer may be made of any appropriate material, such as Cu, Al, W, or Au, etc. Various processes may be used to form the metal gate layer, such as a PVD process, a sputtering process, or an electroplating process, etc.

Thus, a FinFET device may be formed by the above disclosed processes and methods; and the corresponding FinFET structure is illustrated in FIG. 7. As shown in FIG. 7, the FinFET device includes a substrate 50 having a PMOS region and an NMOS region. The FinFET device also includes a plurality of PMOS transistors having different threshold voltages formed on the substrate 50 in the PMOS region; and a plurality of NMOS transistors having different threshold voltages formed on the substrate 50 in the NMOS regions, of which the threshold voltages of the PMOS transistor are adjusted by doping processes; and the threshold voltages of the NMOS transistors are adjusted by forming working function layers with different work functions. Further, the FinFET device also includes an interlayer dielectric layer 51 for electrically insulating transistors between adjacent fins formed on the substrate 50. The detailed structures and intermediate structures are described above with respect to the fabrication processes.

According to the disclosed methods and structures, for the PMOS transistors of the FinFET device, the threshold voltages may be adjusted by doping the fins. The doping method may only need to form a mask to expose the fin needed to be doped, and cover the fins not need to be doped; and dope the exposed fin. While the approach utilizing the work function layers to adjust the threshold voltages of different PMOS transistor may need the similar mask;

and also need to deposit different work function layers made of different materials, etc. Thus, the doping method for adjusting the work function of the PMOS transistors may be relative simple; and the production cost may be reduced.

For the NMOS transistors, by forming work function layers with different working functions on the fins, the threshold voltages on the NMOS transistors may be different. Such a method may be able to precisely adjust the threshold voltages of each of the NMOS transistors. Thus, the threshold voltage mismatch between different NMOS transistors may be reduced. Further, comparing with the approach utilizing the doping processes to adjust the work function, forming work function layers on the fins may have relatively small effects on the portions of the fins being used as the channel regions of the NMOS transistors.

Thus, the threshold voltages of different PMOS transistors in the PMOS region may be adjusted to be different by directly doping the fins in the PMOS region. The threshold voltages of different NMOS transistors in the NMOS region may be adjusted to be different by forming work function layers with different work functions on the fins in the NMOS region. Such an approach may obtain an optimum balance between the process difficulty, the production cost, the stability of the transistors and the effectiveness of the threshold voltage adjustment.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
   providing a substrate having a first region and a second region;
   forming a plurality of fins on the substrate;
   forming a plurality of doping regions with different doping concentrations in the fins in the first region;
   forming a plurality of dummy gate structures over the plurality of fins;
   forming source and drain regions in the plurality of fins at both sides of the dummy gate structures;
   removing the dummy gate structures to form a plurality of openings to expose the plurality of fins;
   forming a plurality of work function layers with different work functions on the exposed fins in the openings in the second region; and
   forming gate structures in the openings.

2. The method according to claim 1, wherein:
   the first region is a PMOS region and the second region is an NMOS region;
   before removing the dummy gate structure, the method further included:
   forming an interlayer dielectric layer exposing top surfaces of the dummy gate structures on the substrate, the source and drain regions, and the fins.

3. The method according to claim 2, wherein:
   the fins in the PMOS region are doped with one of As ions and P ions.

4. The method according to claim 2, before forming the plurality of doping regions in the fins in the PMOS region, further comprising:
   doping the fins in the PMOS region to form a well region of PMOS transistors; and
   doping the fins in the NMOS regions to form a well region of NMOS transistors.

5. The method according to claim 2, wherein forming the interlayer dielectric layer further comprises:
   forming an interlayer dielectric material layer on the dummy gate structures, the source and drain regions, and the substrate; and
   planarizing the interlayer dielectric material layer until the top surfaces of the dummy gate structures are exposed.

6. The method according to claim 2, wherein forming the plurality of dummy gate structures further comprises:
   forming a dummy gate oxide layer over the plurality of fins in the PMOS region and the NMOS region; and
   forming a polysilicon layer on the dummy gate oxide layer.

7. The method according to claim 6, wherein removing the dummy gate structures further comprises:

removing the polysilicon layer; and
removing the dummy gate oxide layer.

8. The method according to claim 2, after removing the dummy gate structures and before forming the plurality of work function layers with different work functions, further comprising:
forming an oxide interlayer on the fins exposed by the openings in the NMOS region and the PMOS region;
forming a high-K dielectric layer on the oxide interlayer;
forming a first cap layer on the high-K dielectric layer;
forming a uniform work function layer on the first cap layer; and
forming a second cap layer on the uniform work function layer.

9. The method according to claim 8, wherein:
the first cap layer and the second cap are made of one of TiN, Ta and TaN;
the high-K dielectric layer is made of one of of LaO, AlO, BaZrO, HfZrO, HfZrON, HfLaO, HfSiO, HfSiON, LaSiO, AlSiO, HfTaO, (Ba, Sr)TiO$_3$ (BST), Al$_2$O$_3$, Si$_3$N$_4$, and oxynitride; and
the uniform work function layer is made of TiN.

10. The method according to claim 8, before forming the plurality of work function layers on the exposed fins in the openings in the NMOS region, further comprising:
removing the second cap layer in the NMOS region; and
removing the uniform work function layer in the NMOS region.

11. The method according to claim 2, wherein forming the plurality of work function layers on the exposed fins in the openings in the NMOS region further comprises:
doping the work function layers, wherein doping ions include one or more of N ions, H ions, F ions, O ions, Al ions, Ta ions, C ions, and P ions.

12. The method according to claim 2, wherein forming gate structures in the openings further comprises:
forming a gate dielectric layer in each of the openings; and
forming a metal gate layer on the gate dielectric layer.

13. The method according to claim 2, wherein forming the source/drain regions in the fins further comprises:
forming openings in the fins at both sides of the dummy gate structures; and
forming a source/drain material layer in the openings by an epitaxial growth process.

14. A FinFET device, comprising:
a substrate having a PMOS region and an NMOS region;
a plurality of PMOS transistors having different threshold voltages formed in the PMOS region of the substrate; and
a plurality of NMOS transistors having different threshold voltages formed in the NMOS region of the substrate;
wherein:
the threshold voltages of the NMOS transistor are adjusted by forming a plurality of work function layers have different work functions; and
the threshold voltages of the PMOS transistors are adjusted by forming a plurality of doping regions having different doping concentrations in fins in the PMOS region.

15. The FinFET device according to claim 14, wherein:
doping ions of the doping regions in the PMOS transistors are one of As ions and P ions.

16. The FinFET device according to claim 14, further comprising:
a well region of the PMOS transistors in the PMOS region; and
a well region of the NMOS transistors in the NMOS region.

17. The FinFET device according to claim 14, further comprising,
an oxide transition layer formed between the fins of the NMOS transistors and corresponding work function layers and between the fins of the NMOS transistors and corresponding gate structures;
a high-K dielectric layer formed on the oxide interlayer;
a first cap layer formed on the high-K dielectric layer;
a uniform work function layer formed on the first cap layer in the PMOS region; and
a second cap layer formed on the uniform work function layer in the PMOS region.

18. The FinFET device according to claim 17, wherein:
the first cap layer and the second cap are made of one of TiN, Ta and TaN;
the high-K dielectric layer is made of one of LaO, AlO, BaZrO, HfZrO, HfZrON, HfLaO, HfSiO, HfSiON, LaSiO, AlSiO, HfTaO, (Ba, Sr)TiO$_3$ (BST), Al$_2$O$_3$, Si$_3$N$_4$, and oxynitride; and
the uniform work function layer is made of TiN.

19. The FinFET device according to claim 14, wherein gate structures of the PMOS transistors and the NMOS transistors further comprise:
a gate dielectric layer formed on the fins; and
a metal gate layer formed on the gate dielectric layer.

20. The FinFET device according to claim 14, further comprising:
an interlayer dielectric layer formed on the substrate insolating transistors between adjacent fins.

* * * * *